United States Patent
Bibee (10) Patent No.: US 8,710,901 B2
(45) Date of Patent: Apr. 29, 2014

(54) REFERENCE CIRCUIT WITH CURVATURE CORRECTION USING ADDITIONAL COMPLEMENTARY TO TEMPERATURE COMPONENT

(75) Inventor: Matthew Bibee, Edina, MN (US)

(73) Assignee: LSI Corporation, San Jose, NY (US)

( * ) Notice: Subject to any disclaimer, the term of this patent is extended or adjusted under 35 U.S.C. 154(b) by 84 days.

(21) Appl. No.: 13/555,410

(22) Filed: Jul. 23, 2012

(65) Prior Publication Data
US 2014/0022662 A1    Jan. 23, 2014

(51) Int. Cl.
*H01L 35/00* (2006.01)

(52) U.S. Cl.
USPC .................................. 327/513; 327/539

(58) Field of Classification Search
USPC .............. 323/313, 314; 327/512, 513, 539
See application file for complete search history.

(56) References Cited

U.S. PATENT DOCUMENTS

| | | | |
|---|---|---|---|
| 4,260,946 A | 4/1981 | Wheatley, Jr. | |
| 4,298,835 A | 11/1981 | Rowe | |
| 4,477,737 A | 10/1984 | Ulmer et al. | |
| 5,471,131 A * | 11/1995 | King et al. | 323/314 |
| 5,864,225 A | 1/1999 | Bryson | |
| 6,184,743 B1 | 2/2001 | Swart | |
| 6,255,807 B1 | 7/2001 | Doorenbos et al. | |
| 6,288,525 B1 | 9/2001 | Fischer | |
| 6,791,396 B2 | 9/2004 | Shor et al. | |
| 6,828,847 B1 | 12/2004 | Marinca | |
| 7,253,598 B1 | 8/2007 | Doyle et al. | |
| 7,495,505 B2 * | 2/2009 | Chang et al. | 327/539 |
| 7,777,466 B2 | 8/2010 | Crippa et al. | |
| 7,872,825 B2 | 1/2011 | Sanghvi | |
| 2005/0184797 A1 | 8/2005 | Choi | |
| 2005/0285666 A1 | 12/2005 | Garlapati et al. | |
| 2006/0001412 A1 | 1/2006 | Fernald | |
| 2007/0069711 A1 | 3/2007 | Dadashev et al. | |
| 2007/0170906 A1 | 7/2007 | Marinca | |
| 2010/0301832 A1 | 12/2010 | Katyal et al. | |

OTHER PUBLICATIONS

K.N. Leung et al., "A 2-V 23-μA 5.3-ppm/° C. Curvature-Compensated CMOS Bandgap Voltage Reference," IEEE Journal of Solid-State Circuits, Mar. 2003, pp. 561-564, vol. 38, No. 3.
S. Somvanshi et al., "A Low Power Sub-1 V CMOS Voltage Reference," IEEE International System on Chip (SOC) Conference, Sep. 2008, pp. 271-276.

(Continued)

*Primary Examiner* — Jeffrey Zweizig
(74) *Attorney, Agent, or Firm* — Ryan, Mason & Lewis, LLP (57) ABSTRACT

A reference circuit comprises a first proportional to temperature component providing a first quantity exhibiting a first type of variation as a function of temperature, a first complementary to temperature component providing a second quantity exhibiting a second type of variation as a function of temperature that is complementary to the first type of variation, and curvature correction circuitry. An output of the reference circuit provides a reference signal generated based on a combination of the first and second quantities. The curvature correction circuitry is coupled to the reference circuit output and comprises at least one additional complementary to temperature component. The curvature correction circuitry adjusts the reference signal in a feedback arrangement to compensate for a temperature response bowing effect attributable to combining the first and second quantities. The reference circuit may be implemented in a disk-based storage device for use in fly height control or other control functions.

20 Claims, 5 Drawing Sheets

(56) References Cited

OTHER PUBLICATIONS

I.M. Filanovsky et al., "BiCMOS Cascaded Bandgap Voltage Reference," IEEE 39th Midwest Symposium on Circuits and Systems, Aug. 1996, pp. 943-946, vol. 2.

M. Ueda et al., "A 3.3V ASIC for Mixed Voltage Applications With Shut Down Mode," IEEE Custom Integrated Circuits Conference, May 1993, pp. 25.5.1-25.5.4.

G.W. Den Besten et al., "Embedded 5 V-to-3.3 V Voltage Regulator for Supplying Digital IC's in 3.3 V CMOS Technology," IEEE Journal of Solid-State Circuits, Jul. 1998, pp. 956-962, vol. 33, No. 7.

* cited by examiner

REFERENCE CIRCUIT WITH CURVATURE CORRECTION USING ADDITIONAL COMPLEMENTARY TO TEMPERATURE COMPONENT

BACKGROUND

Disk-based storage devices such as hard disk drives (HDDs) are used to provide non-volatile data storage in a wide variety of different types of data processing systems. A typical HDD comprises a spindle which holds one or more flat circular storage disks, also referred to as platters. Each storage disk comprises a substrate made from a non-magnetic material, such as aluminum or glass, which is coated with one or more thin layers of magnetic material. In operation, data is read from and written to tracks of the storage disk via a read/write head that is moved precisely across the disk surface by a positioning arm as the disk spins at high speed. The storage capacity of HDDs continues to increase, and HDDs that can store multiple terabytes (TB) of data are currently available.

HDDs often include a system-on-chip (SOC) to process data received from a computer or other processing device into a suitable form to be written to the storage disk, and to transform signal waveforms read back from the storage disk into data for delivery to the processing device. The SOC has extensive digital circuitry and has typically utilized advanced complementary metal-oxide-semiconductor (CMOS) technologies to meet cost and performance objectives. The HDD also generally includes a preamplifier that interfaces the SOC to the read/write head used to read data from and write data to the storage disk. As is well known, the read/write head may comprise, for example, separate read and write heads.

One control function of the HDD that is typically implemented in or otherwise supported by the preamplifier is electronic fly height control. As the operating temperature of the HDD changes, it is desirable to keep the fly height, or spacing between the read/write head and the storage disk surface, as constant as possible. In an exemplary fly height control arrangement, a resistive heating element is incorporated near a pole tip of the read/write head such that the space between the read/write head and the surface of the storage disk can be electronically controlled via thermal expansion.

A bandgap reference circuit is typically utilized to provide a voltage reference for the fly height control. A bandgap reference may be generated by combining two unlike quantities, such as a voltage that is proportional to absolute temperature (PTAT) and a voltage that is complementary to absolute temperature (CTAT). Similar results can be achieved using currents instead of voltages as the PTAT and CTAT quantities that are combined to provide the bandgap reference.

In either case, the PTAT and CTAT quantities combine to produce a reference that is substantially independent of temperature, at least to first order. However, the PTAT and CTAT quantities do not completely cancel one another. For example, while it is possible to produce a PTAT voltage that is highly linear with temperature, a CTAT voltage is more difficult to produce, and generally does not exhibit as high a degree of linearity with temperature as the PTAT voltage, particularly when implemented in a silicon integrated circuit. Such differences in linearity between the PTAT and CTAT voltages with temperature tend to produce a bandgap voltage reference having a temperature response curve that exhibits an undesirable downward bowing effect.

A conventional bandgap reference circuit may therefore not provide a sufficiently stable output over temperature, leading to difficulties in maintaining stable fly height in the HDD. Similar performance problems can arise in other types of control applications that utilize a bandgap reference circuit.

SUMMARY

Illustrative embodiments of the invention provide HDDs or other types of storage devices that exhibit enhanced operating performance by incorporating a reference circuit with improved temperature stability.

In one embodiment, a reference circuit comprises a first proportional to temperature component providing a first quantity exhibiting a first type of variation as a function of temperature, a first complementary to temperature component providing a second quantity exhibiting a second type of variation as a function of temperature that is complementary to the first type of variation, and curvature correction circuitry. An output of the reference circuit provides a reference signal generated based at least in part on a combination of the first and second quantities. The curvature correction circuitry is coupled to the reference circuit output and comprises at least one additional complementary to temperature component.

By way of example, the curvature correction circuitry may be configured to adjust the reference signal in a feedback arrangement to compensate for a temperature response bowing effect resulting from the combination of the first and second quantities. In such an arrangement, a third quantity provided by said at least one additional complementary to temperature component may be fed back to adjust a combined voltage provided by the first proportional to temperature component and the first complementary to temperature component in order to provide a more stable temperature response.

The reference circuit may be implemented in an HDD or other disk-based storage device for use in fly height control or other temperature sensitive control functions. However, the reference circuit is more broadly applicable for use in a wide variety of other types of processing devices.

One or more of the embodiments of the invention provide significant improvements in storage devices and other types of devices that incorporate reference circuits. For example, by substantially eliminating the undesirable downward bowing effect characteristic of the temperature response of conventional bandgap reference circuits, embodiments of the present invention provide a more stable voltage reference output in the presence of varying temperature, thereby enhancing device performance. As a result, HDDs incorporating a voltage reference circuit in accordance with such an embodiment can maintain a more stable fly height over temperature, leading to improved overall drive performance in reading from and writing to storage disks. The improved temperature stability can be achieved in a given embodiment using curvature correction circuitry that is self-correcting and does not require time-consuming calibration at multiple temperatures.

DETAILED DESCRIPTION

Embodiments of the invention will be illustrated herein in conjunction with exemplary disk-based storage devices, reference circuits and associated curvature correction circuitry. It should be understood, however, that these and other embodiments of the invention are more generally applicable to any storage device or other processing device in which improved reference signal temperature stability is desired. Additional embodiments may be implemented using components other than those specifically shown and described in conjunction with the illustrative embodiments.

Figure 1:
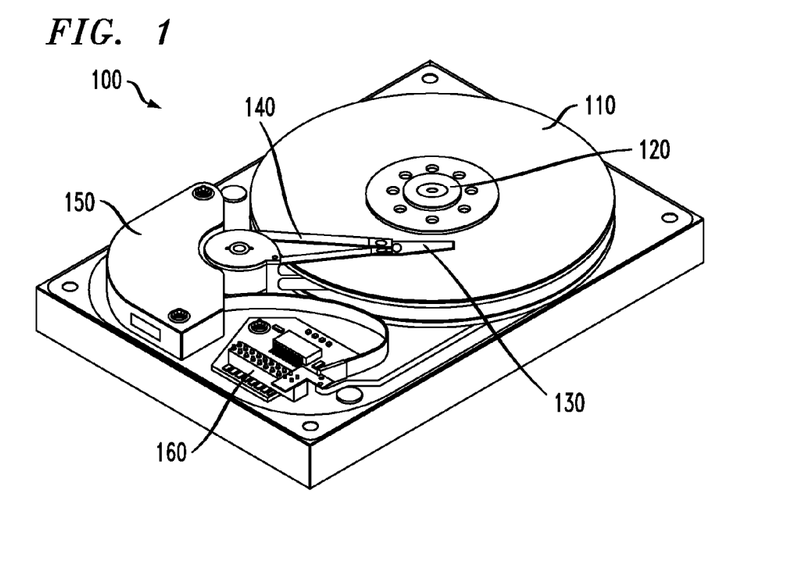
FIG. 1 shows a perspective view of a disk-based storage device in accordance with an illustrative embodiment of the invention.

FIG. 1 shows a disk-based storage device 100 in accordance with an illustrative embodiment of the invention. The storage device 100 in this embodiment more specifically comprises an HDD that includes a storage disk 110. The storage disk 110 has a storage surface coated with one or more magnetic materials that are capable of storing data bits in the form of respective groups of media grains oriented in a common magnetization direction (e.g., up or down). The storage disk 110 is connected to a spindle 120. The spindle 120 is driven by a spindle motor, not explicitly shown in the figure, in order to spin the storage disk 110 at high speed.

Data is read from and written to the storage disk 110 via a read/write head 130 that is mounted on a positioning arm 140. It is to be appreciated that the head 130 is shown only generally in FIG. 1. The position of the read/write head 130 over the magnetic surface of the storage disk 110 is controlled by an electromagnetic actuator 150. The electromagnetic actuator 150 and its associated driver circuitry in the present embodiment may be viewed as comprising a portion of what is more generally referred to herein as "control circuitry" of the storage device 100. Such control circuitry in this embodiment is assumed to further include additional electronics components arranged on an opposite side of the assembly and therefore not visible in the perspective view of FIG. 1.

The term "control circuitry" as used herein is therefore intended to be broadly construed so as to encompass, by way of example and without limitation, drive electronics, signal processing electronics, and associated processing and memory circuitry, and may encompass additional or alternative elements utilized to control positioning of a read/write head relative to a storage surface of a storage disk in a storage device. A connector 160 is used to connect the storage device 100 to a host computer or other related processing device.

It is to be appreciated that, although FIG. 1 shows an embodiment of the invention with only one instance of each of the single storage disk 110, read/write head 130, and positioning arm 140, this is by way of illustrative example only, and alternative embodiments of the invention may comprise multiple instances of one or more of these or other drive components. For example, one such alternative embodiment may comprise multiple storage disks attached to the same spindle so all such disks rotate at the same speed, and multiple read/write heads and associated positioning arms coupled to one or more actuators.

A given read/write head as that term is broadly used herein may be implemented in the form of a combination of separate read and write heads. More particularly, the term "read/write" as used herein is intended to be construed broadly as read and/or write, such that a read/write head may comprise a read head only, a write head only, a single head used for both reading and writing, or a combination of separate read and write heads. A given read/write head such as read/write head 130 may therefore include both a read head and a write head. Such heads may comprise, for example, write heads with wrap-around or side-shielded main poles, or any other types of heads suitable for recording and/or reading data on a storage disk. Read/write head 130 when performing write operations may be referred to herein as simply a write head.

Also, the storage device 100 as illustrated in FIG. 1 may include other elements in addition to or in place of those specifically shown, including one or more elements of a type commonly found in a conventional implementation of such a storage device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other storage device configurations may be used in implementing embodiments of the invention.

Figure 2:
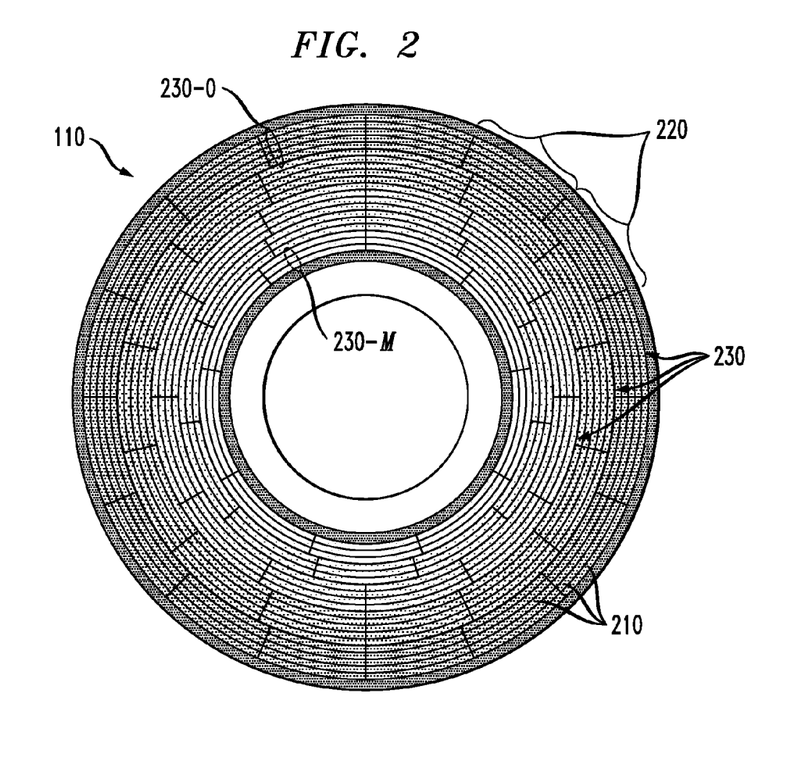
FIG. 2 shows a plan view of a storage disk in the storage device of FIG. 1.

FIG. 2 shows the storage surface of the storage disk 110 in greater detail. As illustrated, the storage surface of storage disk 110 comprises a plurality of concentric tracks 210. Each track is subdivided into a plurality of sectors 220. The tracks located toward the outside edge of the storage disk 110 have a larger circumference when compared to those located toward the center of the storage disk. The tracks are grouped into several annular zones 230, where the tracks within a given one of the zones have the same number of sectors. Those tracks in the outer zones have more sectors than those located in the inner zones. In this example, it is assumed that the storage disk 110 comprises M+1 zones, including an outermost zone 230-0 and an innermost zone 230-M.

The outer zones of the storage disk 110 provide a higher data transfer rate than the inner zones. This is in part due to the fact that the storage disk in the present embodiment, once accelerated to rotate at operational speed, spins at a constant angular or radial speed regardless of the positioning of the read/write head, but the tracks of the inner zones have smaller circumference than those of the outer zones. Thus, when the read/write head is positioned over one of the tracks of an outer zone, it covers a greater linear distance along the disk surface for a given 360° turn of the storage disk than when it is positioned over one of the tracks of an inner zone. Such an arrangement is referred to as having constant angular velocity (CAV), since each 360° turn of the storage disk takes the same amount of time, although it should be understood that CAV operation is not a requirement of embodiments of the invention.

Data bit density is generally constant across the entire storage surface of the storage disk 110, which results in higher data transfer rates at the outer zones. Accordingly, the outermost annular zone 230-0 of the storage disk has a higher average data transfer rate than the innermost annular zone 230-M of the storage disk. The average data transfer rates may differ between the innermost and outermost annular zones in a given embodiment by more than a factor of two. As one example embodiment, provided by way of illustration only, the outermost annular zone may have a data transfer rate of approximately 2.3 Gigabits per second (Gb/s), while the innermost annular zone has a data transfer rate of approximately 1.0 Gb/s. In such an implementation, the HDD may more particularly have a total storage capacity of 500 GB and a spindle speed of 7200 RPM, with the data transfer rates ranging, as noted above, from about 2.3 Gb/s for the outermost zone to about 1.0 Gb/s for the innermost zone.

The storage disk 110 may include a timing pattern formed on its storage surface. Such a timing pattern may comprise one or more sets of servo address marks (SAMs) or other types of servo marks formed in particular sectors in a conventional manner.

The particular data transfer rates and other features referred to in the embodiment described above are presented for purposes of illustration only, and should not be construed as limiting in any way. A wide variety of other data transfer rates and storage disk configurations may be used in other embodiments.

Embodiments of the invention will be described below in conjunction with FIGS. 3 to 7, in which the storage device 100 of FIG. 1 is configured to implement at least one reference circuit utilized to supply a reference signal to at least one control block of the storage device 100, such as a fly height control block. The reference circuit comprises a first PTAT component or other proportional to temperature component providing a first quantity exhibiting a first type of variation as a function of temperature, a first CTAT component or other complementary to temperature component providing a second quantity exhibiting a second type of variation as a function of temperature that is complementary to the first type of variation, and curvature correction circuitry. An output of the reference circuit provides a reference signal generated based at least in part on a combination of the first and second quantities, and the curvature correction circuitry is coupled to the reference circuit output and comprises at least one additional CTAT component or other complementary to temperature component. The "quantities" provided by the respective components may comprise currents, voltages, resistances or other circuit parameters in any combination, and this term is therefore intended to be broadly construed herein.

The curvature correction circuitry in one or more of the embodiments to be described is configured to adjust the reference signal in a feedback arrangement to compensate for a temperature response bowing effect resulting from the combination of the first and second quantities. As a result, a more stable reference signal is provided in the presence of varying temperature, thereby enhancing storage device performance.

Figure 3:
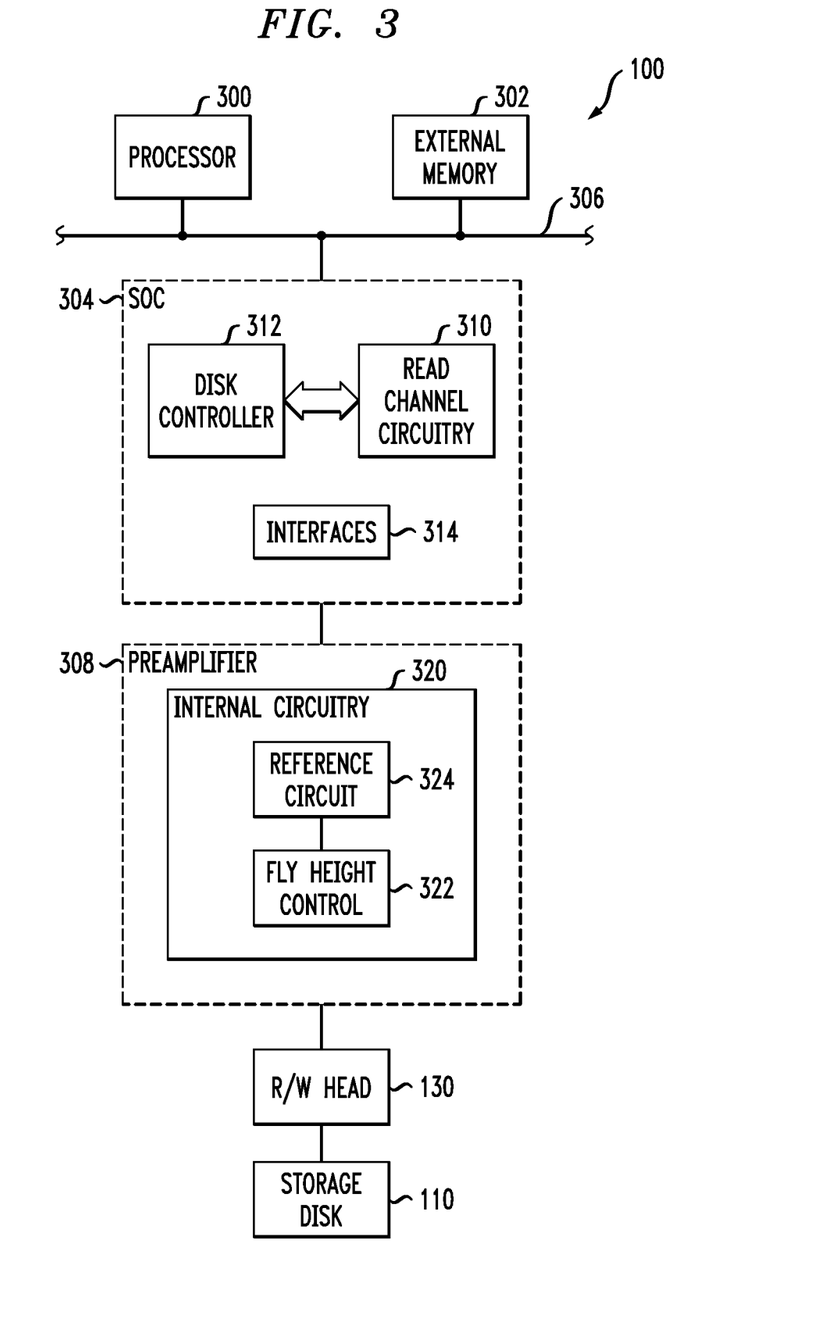
FIG. 3 is a block diagram of a portion of the storage device of FIG. 1 including an exemplary preamplifier comprising a reference circuit with curvature control circuitry.

FIG. 3 shows a portion of the storage device 100 of FIG. 1 in greater detail. In this view, the storage device 100 comprises a processor 300, a memory 302 and a system-on-a-chip (SOC) 304, which communicate over a bus 306. The storage device further comprises a preamplifier 308 providing an interface between the SOC 304 and the read/write head 130. The memory 302 is an external memory relative to the SOC 304 and other components of the storage device 100, but is nonetheless internal to that storage device. The SOC 304 in the present embodiment includes read channel circuitry 310 and a disk controller 312, and directs the operation of the read/write head 130 in reading data from and writing data to the storage disk 110.

The bus 306 may comprise, for example, one or more interconnect fabrics. Such fabrics may be implemented in the present embodiment as Advanced eXtensible Interface (AXI) fabrics, described in greater detail in, for example, the Advanced Microcontroller Bus Architecture (AMBA) AXI v2.0 Specification, which is incorporated by reference herein. The bus may also be used to support communications between other system components, such as between the SOC 304 and the preamplifier 308. It should be understood that AXI interconnects are not required, and that a wide variety of other types of bus configurations may be used in embodiments of the invention.

The processor 300, memory 302, SOC 304 and preamplifier 308 may be viewed as collectively comprising one possible example of "control circuitry" as that term is utilized herein. Numerous alternative arrangements of control circuitry may be used in other embodiments, and such arrangements may include only a subset of the components 300, 302, 304 and 308, or portions of one or more of these components. For example, the SOC 304 itself may be viewed as an example of "control circuitry." The control circuitry of the storage device 100 in the embodiment as shown in FIG. 3 is generally configured to process data received from and supplied to the read/write head 130 and to control positioning of the read/write head 130 relative to the storage disk 110.

It should be noted that certain operations of the SOC 304 or other components of the storage device 100 of FIG. 3 may be directed by processor 300, which executes code stored in external memory 302. For example, the processor 300 may be configured to execute code stored in the memory 302 for performing functionality associated with one or more control blocks of the preamplifier 308, such as initiating or terminating a fly height control process. Thus, at least a portion of the functionality of the storage device 100 may be implemented at least in part in the form of software code.

The external memory 302 may comprise electronic memory such as random access memory (RAM) or read-only memory (ROM), in any combination. In the present embodiment, it is assumed without limitation that the external memory 302 is implemented at least in part as a double data rate (DDR) synchronous dynamic RAM (SDRAM), although a wide variety of other types of memory may be used in other embodiments. The memory 302 is an example of what is more generally referred to herein as a "computer-readable storage medium." Such a medium may also be writable.

Although the SOC 304 in the present embodiment is assumed to be implemented on a single integrated circuit, that integrated circuit may further comprise portions of the processor 300, memory 302, bus 306 and preamplifier 308. Alternatively, portions of the processor 300, memory 302, bus 306 and preamplifier 308 may be implemented at least in part in the form of one or more additional integrated circuits, such as otherwise conventional integrated circuits designed for use in an HDD and suitably modified to implement one or more reference circuits with curvature control as disclosed herein.

An example of an SOC integrated circuit that may be modified for use in embodiments of the invention is disclosed in U.S. Pat. No. 7,872,825, entitled "Data Storage Drive with Reduced Power Consumption," which is commonly assigned herewith and incorporated by reference herein.

Other types of integrated circuits that may be used to implement processor, memory or other storage device components of a given embodiment include, for example, a microprocessor, digital signal processor (DSP), application-specific integrated circuit (ASIC), field-programmable gate array (FPGA) or other integrated circuit device.

In an embodiment comprising an integrated circuit implementation, multiple integrated circuit dies may be formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered embodiments of the invention.

Although shown as part of the storage device 100 in the present embodiment, one or both of the processor 300 and memory 302 may be implemented at least in part within an associated processing device, such as a host computer or server in which the storage device is installed. Accordingly, elements 300 and 302 in the FIG. 3 embodiment may be viewed as being separate from the storage device 100, or as representing composite elements each including separate processing or memory circuitry components from both the storage device and its associated processing device. As noted above, at least portions of the processor 300 and memory 302 may be viewed as comprising "control circuitry" as that term is broadly defined herein.

Referring now more particularly to the preamplifier 308 of the storage device 100, the preamplifier in this embodiment comprises internal circuitry 320 which includes a fly height control block 322 coupled to a reference circuit 324. The internal circuitry 320 may comprise additional circuitry not explicitly shown, such as one or more write drivers as well as additional control blocks.

The fly height control block 322 is of conventional design and often tends to be highly sensitive to reference signal variations over temperature. Thus, the above-described typical bandgap voltage reference, which exhibits a downward bowing effect in its temperature response curve, can lead to difficulties in maintaining stable fly height in the HDD. The reference circuit 324 in the present embodiment includes curvature correction circuitry which removes or otherwise substantially eliminates the undesirable downward bowing effect, leading to a more stable output over temperature. This improved temperature stability can benefit other control blocks or circuitry of the preamplifier 308. Thus, the output of the reference circuit 324 can be applied to other portions of the preamplifier, in place of or in addition to the fly height control block 322.

Figure 4:
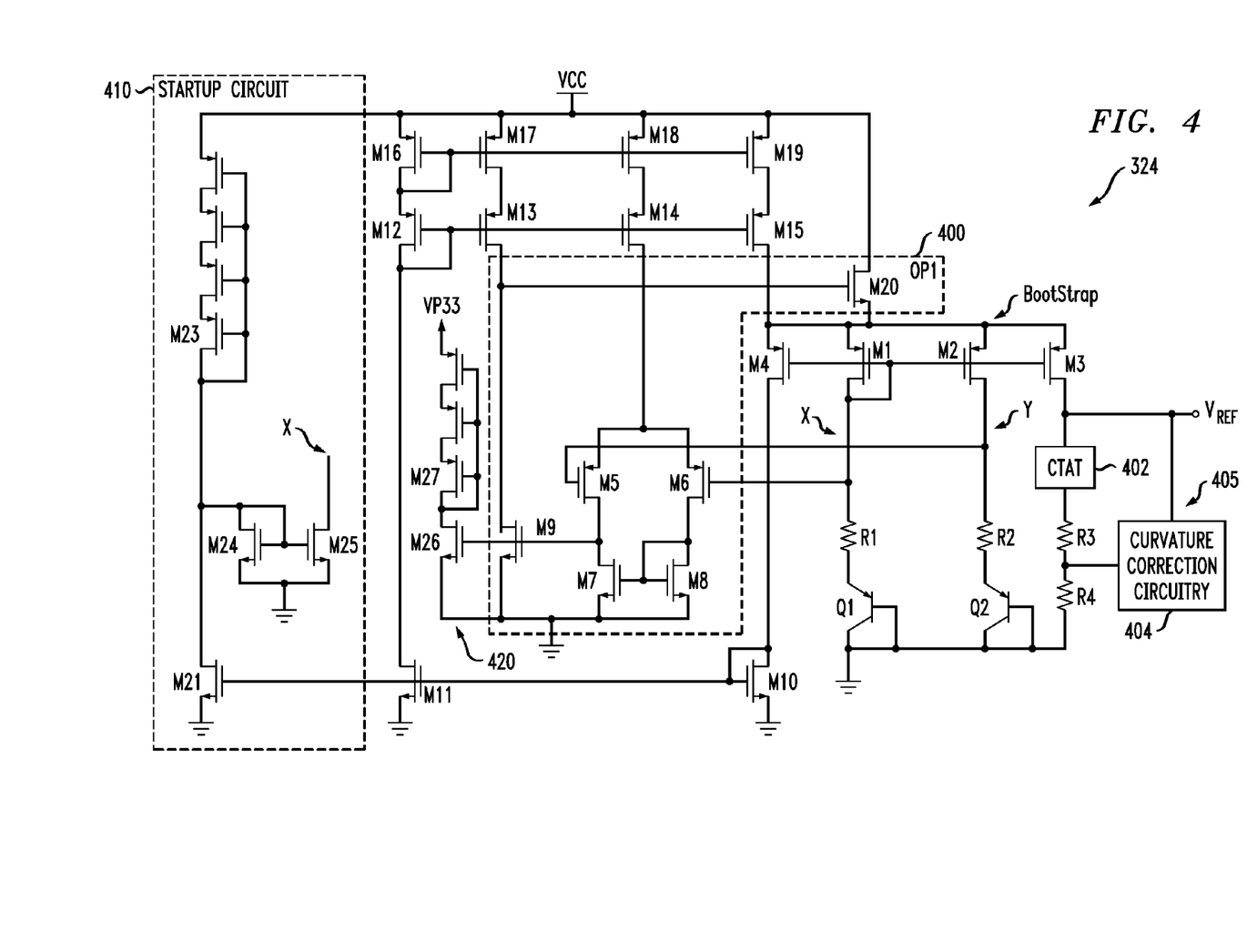
FIGS. 4 and 5 are schematic diagrams showing portions of the reference circuit of the preamplifier of FIG. 3.

FIG. 4 shows a more detailed view of the reference circuit 324 in an illustrative embodiment. In this embodiment, the reference circuit 324 comprises a PTAT generator comprising operational amplifier 400, also denoted OP1, p-type MOS (PMOS) devices M1, M2, M3 and M4, diode-connected p-n-p transistors Q1 and Q2, and resistors R1 and R2. The PTAT generator of FIG. 4 is an example of what is more generally referred to herein as a "proportional to temperature component" that provides a first quantity exhibiting a first type of variation as a function of temperature. More particularly, in this embodiment, the PTAT generator provides a PTAT current through device M3.

The reference circuit 324 further comprises a first CTAT generator 402 coupled between the drain of M3 and an upper terminal of a resistive divider network comprising resistors R3 and R4. The CTAT generator 402 is an example of what is more generally referred to herein as a "complementary to temperature component" that provides a second quantity exhibiting a second type of variation as a function of temperature that is complementary to the first type of variation provided by the proportional to temperature component.

The current passing through the CTAT generator 402 is a PTAT current. By Ohm's law this current is multiplied the sum of R3 and R4 to create a PTAT voltage across R3 and R4. However, biasing a bipolar transistor such as Q3 with a PTAT current produces a base-emitter voltage in Q3 that is CTAT. Accordingly, the voltage across the CTAT generator 402 is a CTAT voltage. Note that at this point we ignore the current contribution from curvature correction circuitry 404.

The drain of device M3 represents an output of the reference circuit 324, and provides a reference signal, in this case a bandgap voltage reference denoted $V_{REF}$, that is generated based on a combination of the CTAT voltage across the CTAT generator 402 and the PTAT voltage across R3 and R4.

Also included in the reference circuit 324 is curvature correction circuitry 404 that is arranged in a feedback path 405 that passes from the reference circuit output to a point between the resistors R3 and R4. As will be described in greater detail below in conjunction with FIG. 5, the curvature correction circuitry 404 comprises at least one additional complementary to temperature component, in this embodiment another CTAT generator. The curvature correction circuitry 404 is configured to adjust the reference signal $V_{REF}$ in a feedback arrangement to compensate for a temperature response bowing effect resulting from the above-described combination of the CTAT voltage across the CTAT generator 402 and the PTAT voltage across R3 and R4.

The operational amplifier OP1 of the PTAT generator is illustratively implemented as a three-stage operational amplifier in the present embodiment. PMOS devices M5 and M6 in combination with NMOS devices M7 and M8 collectively form the first stage of OP1, M9 forms the second stage of OP1, and M20 forms the third stage of OP1. The source of M20 drives the node that is labeled "BootStrap" at the sources of M1-M4. OP1 is configured in a feedback arrangement, with the voltage at the BootStrap node being adjusted in a manner that tends to equalize the voltages at nodes X and Y. The voltage on node X is equal to the base-emitter voltage of Q1 plus the voltage drop across R1. Similarly, the voltage on node Y is the base-emitter voltage of Q2 plus the voltage drop across R2. The voltages at nodes X and Y drive the respective gate terminals of devices M5 and M6 at the inputs of OP1. Devices M5-M8 are sized so as to reduce any input offset error. Devices M10-M19 generate bias currents that used to power up OP1.

The reference circuit 324 in the present embodiment further includes a startup circuit 410 and a bandgap invalid circuit 420, although these and other components may be eliminated, replaced or reconfigured in other embodiments.

The startup circuit 410 comprises devices M21-M25. If there is no PTAT current flowing, then M1-M4, M10 and M21 are all off. The diode-connected devices M23 and M24 will be on and device M25 will pull node X to ground potential. Leakage will cause the gates of M12 and M16 to fall, allowing for a current path through M15, M19, M1, R1 and Q1. Current flow through M1 will cause current to flow through M4 which will cause M10 and M11 to provide current to PMOS devices M12-M19. At some point enough current will flow through M10 that M21 will turn on, pulling the gates of M24 and M25 to ground potential, such that M25 can no longer affect the operation of the PTAT generator. Device M23 is implemented as a combination of multiple distinct devices, namely four distinct devices in this particular embodiment.

The bandgap invalid circuit 420 provides a bandgap invalid signal indicating that the reference output can no longer be considered reliable. The output of the first stage M5-M8 of OP1 is a very high gain node and if the VCC supply falls sufficiently there will come a point where OP1 cannot keep nodes X and Y equal. Under such a condition, the very high gain node will follow the VCC supply lower, causing device M26 to turn off and diode-connected device M27 to pull up to the VP33 supply. Thus, in this embodiment, the bandgap invalid circuit 420 provides a bandgap invalid signal that goes high in conjunction with a downward ramping of the supply voltage VCC.

Like device M23, device M27 is also implemented as multiple distinct devices in this embodiment. The particular number of devices comprising M27, illustratively shown as three devices in the figure, is chosen to limit the amount of current flowing during normal operation of the reference circuit. The bandgap invalid circuit 420 produces a bandgap invalid signal in the presence of a falling supply, but does not provide any similar indication in the case of a rising supply. That is, it does not indicate when VCC has ramped up to a point where the bandgap voltage is considered valid.

Figure 5:
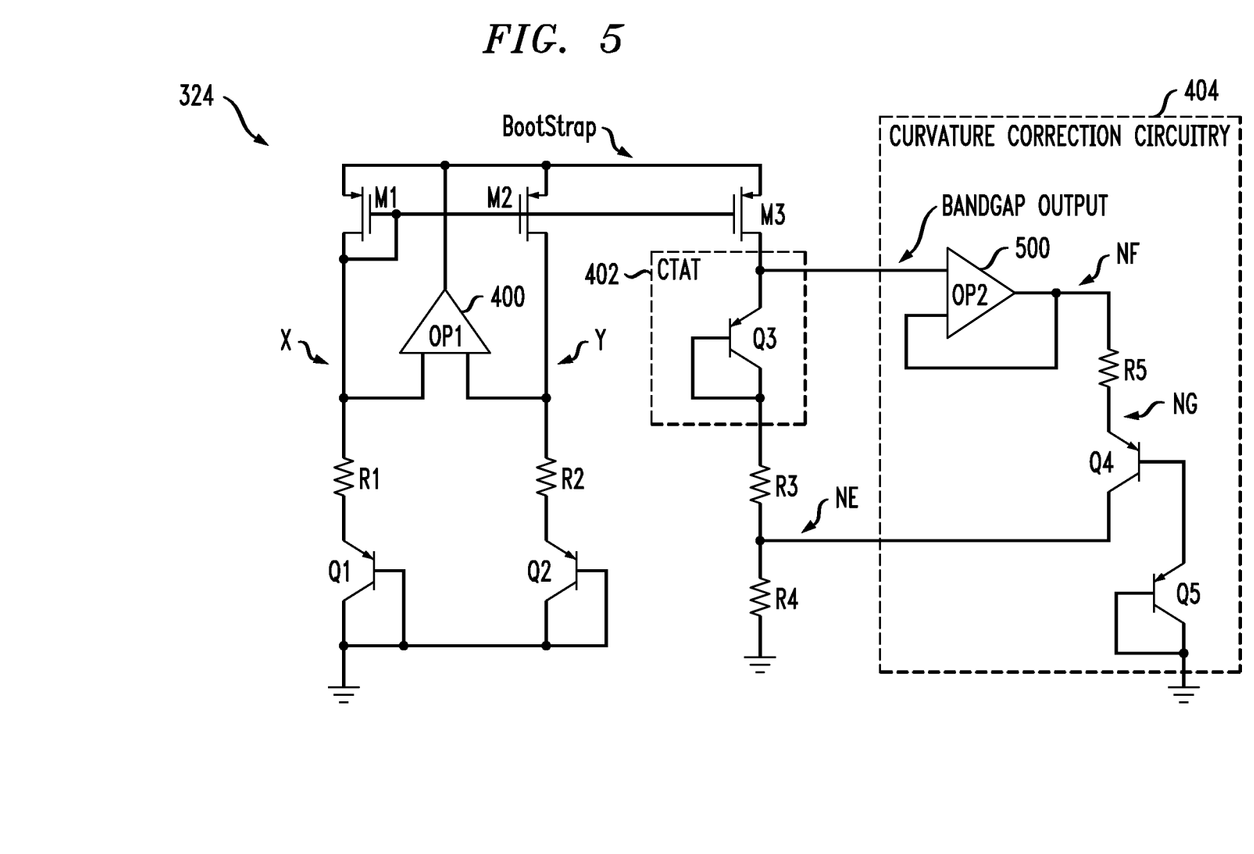

With reference now to FIG. 5, first CTAT generator 402 is illustratively implemented as a diode-connected p-n-p transistor Q3 having an emitter coupled to the reference circuit output $V_{REF}$, and a base and a collector that are coupled together and to an upper terminal of the resistive divider network formed by R3 and R4. The curvature correction circuitry 404 as illustrated in FIG. 5 comprises an operational amplifier 500, also denoted OP2, having a first input coupled to the reference circuit output $V_{REF}$, and a second input coupled to an output of the operational amplifier. The curvature correction circuitry further comprises p-n-p bipolar transistors Q4 and Q5, with Q4 having an emitter coupled to the output of the operational amplifier 500 via resistor R5, a base coupled to an emitter of Q5, and a collector coupled to node NE between resistors R3 and R4. The transistor Q5 in the present embodiment is the above-noted additional CTAT generator, and has a base and a collector that are coupled together and to a lower supply potential, illustratively ground potential. An intermediate terminal of the resistive divider network formed by R3 and R4 is coupled to the collector of Q4 at node NE and a lower terminal of the resistive divider network is coupled to the lower supply potential.

In the present embodiment, the diode-connected p-n-p transistors Q3 and Q5 are assumed to comprise vertical p-n-p bipolar transistors that are formed without a silicon germanium (SiGe) implant, although other types of transistors may be used. These transistors may be formed on a common integrated circuit die in sufficient proximity to one another so as to exhibit similar variations as a function of temperature. The use of vertical p-n-p transistors without SiGe implants avoids the unpredictable temperature performance associated with n-p-n transistors that typically include such implants. Similar configurations may be used for other bipolar transistors of the reference circuit 324, such as Q1, Q2 and Q4.

The second CTAT generator comprising transistor Q5 is generally configured to track out error that would otherwise be introduced in the $V_{REF}$ output as a function of temperature by the first CTAT generator comprising transistor Q3. Thus, for example, as temperature increases and the CTAT error attributable to Q3 becomes more pronounced, a similar error with greater magnitude will occur in Q4 and Q5. This is converted to a current that is fed into R4 and thereby converted to a voltage. This correcting voltage in conjunction with the first PTAT voltage and the first CTAT voltage provide a voltage reference output $V_{REF}$ that is significantly more stable as a function of temperature.

The bandgap output given by voltage reference $V_{REF}$ at the drain of M3 is copied by OP2 and produced on node NF. The voltage at node NG is the sum of the base-emitter voltages of transistors Q4 and Q5. At low temperatures the base-emitter voltages of Q4 and Q5 are high, such that no significant current can flow through R4 and Q4 is effectively off. As temperature increases, the diode voltage of Q5 drops and the base-emitter voltage of Q4 drops, thereby allowing current to start to flow through R5 and out Q4 into node NE.

Thus, the second CTAT generator introduces a correcting current through R4 that rises in proportion to the CTAT error introduced by the first CTAT generator. Accordingly, the voltage at node NG is falling with increasing temperature at a rate that is proportional to the rate at which the base-emitter voltage of Q3 is falling with temperature. At process corners these two errors will tend to track one another.

The ratio of the value of resistor R5 to the value of resistor R4 provides a course scaling of the amount of correction provided by the curvature correction circuitry 404. Also, the base-emitter areas of Q4 and Q5 determine the speed of roll off with temperature. A fine scaling of the amount of correction can therefore be implemented by making the configuration of Q5 digitally adjustable, through controllable selection of a particular number of parallel bipolar devices that are combined to form Q5.

Suitable values for R1 through R5 in one possible implementation are 67 kΩ, 11 kΩ, 12.7 kΩ, 750Ω and 50 kΩ, respectively, although those skilled in the art will appreciate that other values can be used.

As mentioned previously, the reference circuit 324 as illustrated in FIGS. 4 and 5 provides a voltage reference that is much flatter over temperature compared to a conventional bandgap reference composed of one PTAT and one CTAT. For example, in one embodiment, the voltage $V_{REF}$ at the output of the reference circuit 324 is nominally 1.25V and does not change significantly with temperature, process or supply. More particularly, using the curvature correction circuitry 404, variation in $V_{REF}$ over any consecutive 60 degree temperature span in this embodiment was found to be less than about 0.15%.

The illustrative embodiments provide a number of significant advantages relative to conventional reference circuit arrangements. For example, by reducing or eliminating the undesirable downward bowing effect characteristic of the temperature response of conventional bandgap reference circuits, embodiments of the present invention provide a more stable voltage reference output in the presence of varying temperature, thereby enhancing device performance. As a result, HDDs incorporating a voltage reference circuit in accordance with such an embodiment can maintain a more stable fly height over temperature, leading to improved overall drive performance in reading from and writing to storage disks.

Also, the curvature correction loop in the illustrative embodiment is self-correcting and does not require the use of a digital controller, microprocessor or other type of processor. The circuitry may be calibrated at a single temperature in an automated test environment, rather than at multiple temperatures as in conventional arrangements. This provides a significant reduction in test time and therefore production cost.

It is to be appreciated that the particular circuitry arrangements shown in FIGS. 3-5 are presented by way of example only, and other embodiments of the invention may utilize other types and arrangements of circuit elements for implementing curvature correction circuitry for a reference circuit as disclosed herein.

As mentioned previously, the storage device configuration can be varied in other embodiments of the invention. For example, the storage device may comprise a hybrid HDD which includes a flash memory in addition to one or more storage disks.

It should also be understood that the particular storage disk configuration and recording mechanism can be varied in other embodiments of the invention. For example, a variety of recording techniques such as shingled magnetic recording (SMR), bit-patterned media (BPM), heat-assisted magnetic recording (HAMR) and microwave-assisted magnetic recording (MAMR) can be used in one or more embodiments of the invention.

Figure 6:
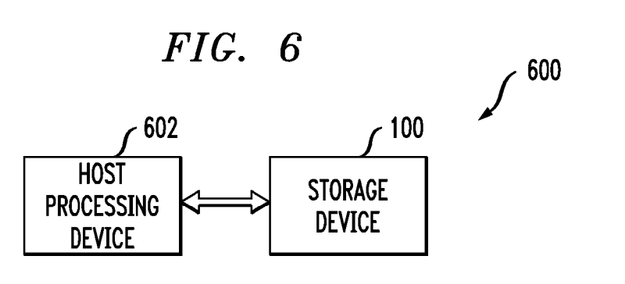
FIG. 6 illustrates interconnection of the storage device of FIG. 1 with a host processing device in a data processing system.

FIG. 6 illustrates a processing system 600 comprising the disk-based storage device 100 coupled to a host processing device 602, which may be a computer, server, communication device, etc. Although shown as a separate element in this figure, the storage device 100 may be incorporated into the host processing device. Instructions such as read commands and write commands directed to the storage device 100 may originate from the processing device 602, which may comprise processor and memory elements similar to those previously described in conjunction with FIG. 3.

Figure 7:
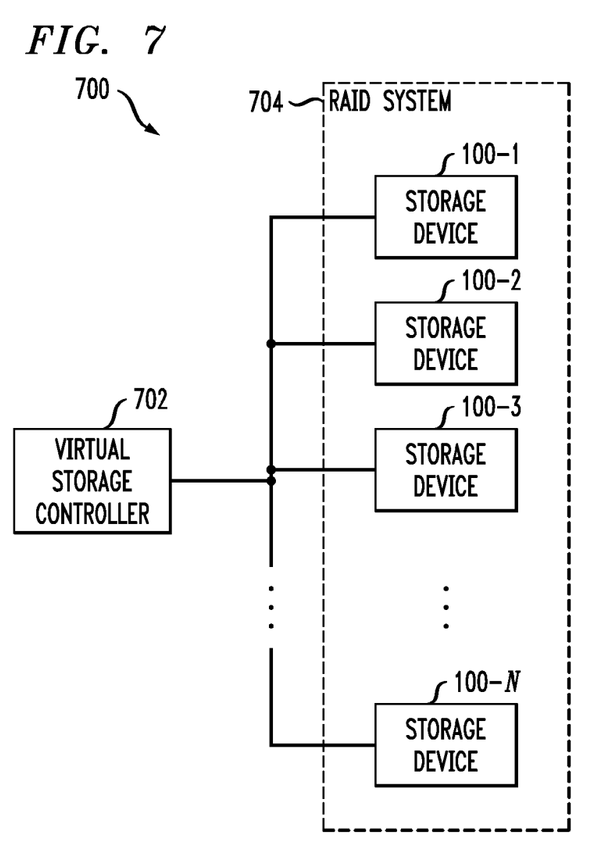
FIG. 7 shows a virtual storage system incorporating a plurality of disk-based storage devices of the type shown in FIG. 1.

Multiple disk-based storage devices 100 may be incorporated into a virtual storage system 700 as illustrated in FIG. 7. The virtual storage system 700, also referred to as a storage virtualization system, illustratively comprises a virtual storage controller 702 coupled to a RAID system 704, where RAID denotes Redundant Array of Independent Disks. The RAID system more specifically comprises N distinct storage devices denoted 100-1, 100-2, ... 100-N, one or more of which are assumed to be configured to include reference circuits with curvature correction circuitry as disclosed herein. These and other virtual storage systems comprising HDDs or other disk-based storage devices of the type disclosed herein are considered embodiments of the invention. The host processing device 602 in FIG. 6 may also be an element of a virtual storage system, and may incorporate the virtual storage controller 702.

Again, it should be emphasized that the above-described embodiments of the invention are intended to be illustrative only. For example, other embodiments can use different types and arrangements of storage disks, read/write heads, control circuitry, preamplifiers, proportional to temperature components, complementary to temperature components, curvature correction circuitry and other storage device elements for implementing the described reference signal generation functionality. Also, the particular types of quantities generated by respective proportional to temperature and complementary to temperature components, and the manner in which those quantities interact or are otherwise combined in generating a voltage reference, current reference or other type of reference signal, may be varied in other embodiments. These and numerous other alternative embodiments within the scope of the following claims will be apparent to those skilled in the art.

What is claimed is:

1. A reference circuit comprising:
a first proportional to temperature component providing a first quantity exhibiting a first type of variation as a function of temperature;
a first complementary to temperature component providing a second quantity exhibiting a second type of variation as a function of temperature that is complementary to the first type of variation; and
curvature correction circuitry;
wherein an output of the reference circuit provides a reference signal generated based at least in part on a combination of the first and second quantities; and
wherein the curvature correction circuitry is coupled to the reference circuit output and comprises at least one additional complementary to temperature component.

2. The reference circuit of claim 1 wherein the curvature correction circuitry is configured to adjust the reference signal in a feedback arrangement to compensate for a temperature response bowing effect resulting from the combination of the first and second quantities.

3. The reference circuit of claim 1 wherein said at least one additional complementary to temperature component comprises a second complementary to temperature component formed on a common integrated circuit die with the first complementary to temperature component so as to exhibit substantially the second type of variation as a function of temperature.

4. The reference circuit of claim 1 wherein the first and at least one additional complementary to temperature components comprise respective diode-connected p-n-p bipolar transistors.

5. The reference circuit of claim 4 wherein the diode-connected p-n-p bipolar transistors comprise vertical p-n-p bipolar transistors formed without a silicon-germanium implant.

6. The reference circuit of claim 1 wherein the curvature correction circuitry comprises:
an operational amplifier having a first input coupled to the reference circuit output, and a second input coupled to an output of the operational amplifier; and
first and second p-n-p bipolar transistors;
the first p-n-p bipolar transistor having an emitter coupled to the output of the operational amplifier, a base coupled to an emitter of the second p-n-p bipolar transistor, and a collector configured to provide a feedback current that is used to adjust a combined voltage provided by the first proportional to temperature component and the first complementary to temperature component;
the second p-n-p bipolar transistor having a base and a collector that are coupled together and to a lower supply potential.

7. The reference circuit of claim 6 wherein the emitter of the first p-n-p bipolar transistor is coupled to the output of the operational amplifier via a resistor.

8. The reference circuit of claim 6 wherein the first complementary to temperature component comprises a third p-n-p bipolar transistor having an emitter coupled to the reference circuit output, a base and a collector that are coupled together and to an upper terminal of a resistive divider network.

9. The reference circuit of claim 8 wherein an intermediate terminal of the resistive divider network is coupled to the collector of the first p-n-p bipolar transistor and a lower terminal of the resistive divider network is coupled to the lower supply potential.

10. The reference circuit of claim 1 wherein the reference circuit is fabricated in at least one integrated circuit.

11. A storage device comprising:
a read/write head configured to read data from and write data to a storage medium; and
control circuitry configured to process data received from and supplied to the read/write head;
wherein the control circuitry comprises:
a reference circuit; and
at least one control block receiving a reference signal from the reference circuit;
wherein the reference circuit comprises:
a first proportional to temperature component providing a first quantity exhibiting a first type of variation as a function of temperature;
a first complementary to temperature component providing a second quantity exhibiting a second type of variation as a function of temperature that is complementary to the first type of variation; and
curvature correction circuitry;
wherein an output of the reference circuit provides a reference signal generated based at least in part on a combination of the first and second quantities; and
wherein the curvature correction circuitry is coupled to the reference circuit output and comprises at least one additional complementary to temperature component.

12. The storage device of claim 11 wherein the control circuitry comprises a preamplifier of the storage device and the reference circuit is implemented within the preamplifier.

13. The storage device of claim 11 wherein the control block receiving the reference signal from the reference circuit comprises a fly height control block configured to control a fly height of the read/write head over the storage medium.

14. A virtual storage system comprising the storage device of claim 11.

15. The storage device of claim 11 wherein the control circuitry further comprises:
at least one integrated circuit comprising a disk controller and read channel circuitry; and
a preamplifier coupled between said at least one integrated circuit and the read/write head;
wherein the reference circuit and said at least one control block are implemented in the preamplifier.

16. The storage device of claim 11 comprising a processor and a memory coupled to the processor, wherein at least a portion of the control circuitry is implemented by the processor executing software code stored in the memory.

17. A method comprising the steps of:
generating a reference signal based at least in part on a combination of:
a first quantity provided by a first proportional to temperature component and exhibiting a first type of variation as a function of temperature; and
a second quantity provided by a first complementary to temperature component and exhibiting a second type of variation as a function of temperature that is complementary to the first type of variation; and
adjusting the reference signal utilizing at least one additional complementary to temperature component.

18. The method of claim 17 wherein the adjusting step comprises adjusting the reference signal in a feedback arrangement to compensate for a temperature response bowing effect resulting from the combination of the first and second quantities.

19. The method of claim 17 wherein the adjusting step comprises feeding back a third quantity provided by said at least one additional complementary to temperature component to at least one of the first proportional to temperature component and the first complementary to temperature component.

20. A non-transitory computer-readable storage medium having embodied therein executable code for initiating performance of the steps of the method of claim 17.

* * * * *